United States Patent
Mokhtari et al.

(10) Patent No.: US 8,147,908 B2
(45) Date of Patent: Apr. 3, 2012

(54) INCREASED THROUGHPUT FOR LARGE-SCALE PRODUCTION OF LOW MELT ORGANOAMINE STABILIZED SILVER NANO-PARTICLES

(75) Inventors: Mahya Mokhtari, Toronto (CA); Roger E. Gaynor, Oakville (CA); Marko D. Saban, Etobicoke (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 12/796,986

(22) Filed: Jun. 9, 2010

(65) Prior Publication Data

US 2011/0305826 A1 Dec. 15, 2011

(51) Int. Cl.
- *H01L 23/48* (2006.01)
- *C09D 11/02* (2006.01)
- *B05D 5/12* (2006.01)
- *B05D 7/00* (2006.01)

(52) U.S. Cl. ........ 427/216; 427/212; 427/215; 427/220; 427/58; 427/96.1; 427/180; 427/189; 427/191; 427/123; 427/125; 977/773; 977/932; 106/31.13; 106/31.65; 106/31.01; 106/31.92; 252/500; 252/512; 252/514

(58) Field of Classification Search .................... 427/212
See application file for complete search history.

(56) References Cited

U.S. PATENT DOCUMENTS

| | | | |
|---|---|---|---|
| 6,107,117 A | 8/2000 | Bao et al. | |
| 2003/0136958 A1 | 7/2003 | Ong et al. | |
| 2003/0160230 A1 | 8/2003 | Ong et al. | |
| 2003/0160234 A1 | 8/2003 | Ong et al. | |
| 2006/0073667 A1* | 4/2006 | Li et al. | 438/311 |
| 2007/0202333 A1* | 8/2007 | O'Brien et al. | 428/402 |
| 2008/0067162 A1 | 3/2008 | Suzuki et al. | |
| 2009/0305247 A1* | 12/2009 | Gao | 435/6 |

OTHER PUBLICATIONS

U.S. Appl. No. 12/369,861, filed Feb. 12, 2009.
U.S. Appl. No. 12/331,573, filed Dec. 10, 2008.
U.S. Appl. No. 12/753,655, filed Apr. 1, 2010.

* cited by examiner

*Primary Examiner* — Nathan Empie
*Assistant Examiner* — Lisha Jiang
(74) *Attorney, Agent, or Firm* — Oliff & Berridge, PLC

(57) ABSTRACT

Process for producing organoamine-stabilized silver nanoparticles with a molar ratio of silver salt to organoamine of about 1:4 to about 1:10 are disclosed. The process includes: forming a solution including an organic solvent and a first amount of organoamine; adding silver salt particles to the solution; adding a second amount of organoamine to the solution; adding a hydrazine to the solution; and reacting the solution to form an organoamine-stabilized silver nanoparticles.

19 Claims, No Drawings

INCREASED THROUGHPUT FOR LARGE-SCALE PRODUCTION OF LOW MELT ORGANOAMINE STABILIZED SILVER NANO-PARTICLES

BACKGROUND

Fabrication of electronic circuit elements using liquid deposition techniques is of profound interest as such techniques provide potentially low-cost alternatives to conventional mainstream amorphous silicon technologies for electronic applications such as thin film transistors (TFTs), light-emitting diodes (LEDs), RFID tags, photovoltaics, etc. However, the deposition and/or patterning of functional electrodes, pixel pads, and conductive traces, lines and tracks which meet the conductivity, processing and cost requirements for practical applications have been a great challenge. Silver is of particular interest as conductive elements for electronic devices because silver is much lower in cost than gold and it possesses much better environmental stability than copper. There is therefore a void, addressed by embodiments herein, for lower cost methods for preparing liquid processable, stable silver compositions that are suitable for fabricating electrically conductive elements of electronic devices.

Solution-processable conductors are of great interest for printed electronic applications as electrodes, conducting lines in thin film transistors, RFID tags, photovoltaics, etc. Silver nanoparticle-based conductive inks represent a promising class of materials for printed electronics. However, most silver nanoparticles necessitate large molecular weight stabilizers to ensure proper solubility and stability in forming a printable solution. These large molecular weight stabilizers inevitably raise the annealing temperature for the silver nanoparticles above 200° C. in order to remove the stabilizers, which temperatures are incompatible with most plastic substrates and can cause damage or deformation thereto.

Further, the use of lower molecular weight stabilizers can also be problematic, as smaller size stabilizers often do not provide desired solubility and often fail to effectively prevent coalescence or aggregation of the silver nanoparticles before use. Therefore, the use of organoamines as stabilizers provides the desired solubility while allowing coalescence or aggregation of the silver nanoparticles.

Prior lab-scale methods for producing silver nanoparticles used multiple steps and were laborious and time-consuming. The results were not reproducible or easily scaled up for large-scale manufacturing. In addition, the resultant product typically manifested as a sticky paste, raising handling issues. The final product also had a short shelf life and low purity.

There is therefore a need, addressed by embodiments of the present disclosure, for lower cost methods for preparing large-scale amounts of liquid processable, stable silver-containing nanoparticle compositions that are suitable for fabricating electrically conductive elements of electronic devices.

SUMMARY

The present application discloses, in various exemplary embodiments, processes for preparing silver-containing nanoparticle compositions, as well as the compositions so produced. Devices that use the nanoparticle compositions, such as thin film transistors, are also disclosed.

Disclosed in embodiments is a process for producing organoamine-stabilized silver nanoparticles, comprising: forming a heated solution comprising an organic solvent and a first amount of organoamine; adding a silver salt to the solution; adding a second amount of organoamine to the solution; adding an organohydrazine to the solution; and precipitating the solution and recovering organoamine-stabilized silver nanoparticles; wherein the molar ratio of silver salt to total organoamine is from about 1:4 to about 1:10.

Also disclosed in embodiments is a process for producing organoamine stabilized silver nanoparticles, comprising: forming a solution comprising an organic solvent and a first amount of organoamine and having a first temperature; adding silver salt to the solution; adding a second amount of organoamine to the solution; cooling the solution down to a second temperature; adding an organohydrazine to the solution; precipitating the solution and recovering organoamine-stabilized silver nanoparticles; cooling the solution down to a third temperature; adding a non-solvent to the solution; adding isopropanol to the solution to separate the silver nanoparticles from the solution; and washing the silver nanoparticles, wherein the molar ratio of silver salt to total organoamine is from about 1:4 to about 1:10.

Also disclosed in embodiments is a method of forming conductive features on a substrate, comprising: providing a liquid composition containing the organoamine-stabilized silver nanoparticles as produced in the above method; depositing the liquid composition onto the substrate to form deposited features; and heating the deposited features on the substrate to a temperature from about 100° C. to about 200° C. to form conductive features on the substrate; wherein the molar ratio of silver salt to total organoamine is from about 1:4 to about 1:10.

These and other characteristics of the disclosure are more particularly disclosed below.

EMBODIMENTS

Described herein are methods for producing organoamine-stabilized silver nanoparticles and methods for making conductive features on a substrate using the organoamine-stabilized silver nanoparticles. The methods of making the nanoparticles achieve a more crystalline silver nanoparticle with a higher silver content. Further, the methods of making the silver nanoparticles have a higher throughput and yield.

The term "nano" as used in "silver nanoparticles" refers to, for example, a particle size of less than about 1,000 nm, such as, for example, from about 0.5 nm to about 1,000 nm, from about 1 to about 500 nm, from about 1 nm to about 100 nm, from about 1 nm to about 25 nm or from about 1 to about 10 nm. The particle size refers to the average diameter of the silver particles, as determined by TEM (transmission electron microscopy) or other suitable method. Generally, a plurality of particle sizes may exist in the silver nanoparticles obtained from the method described herein. In embodiments, the existence of different sized silver nanoparticles is acceptable.

The methods of the present disclosure produce organoamine-stabilized silver nanoparticles. In embodiments, the method comprises: (a) forming a heated solution comprising an organic solvent and a first amount of organoamine; (b) adding a silver salt to the solution; (c) adding a second amount of organoamine to the solution; (d) adding an organohydrazine to the solution; and (e) precipitating the solution and recovering organoamine-stabilized silver nanoparticles; wherein the molar ratio of silver salt to total organoamine added is from about 1:4 to about 1:10, for example, from about 1:4 to about 1:8 or about 1:5.

The organic solvent may be any suitable solvent, and may include, for example toluene, heptane, hexane, benzene, cyclohexane, pentane, bromobenzene, chlorobenzene, other hydrocarbons, and mixtures thereof. Exemplary organic solvents include isoparaffinic solvents available under the name ISOPAR® from ExxonMobil Chemical. Desirably, the first organic solvent is toluene.

The organoamine may be a primary, secondary, or tertiary amine. Exemplary organoamines include propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, N,N-dimethylamine, N,N-dipropylamine, N,N-dibutylamine, N,N-dipentylamine, N,N-dihexylamine, N,N-diheptylamine, N,N-dioctylamine, N,N-dinonylamine, N,N-didecylamine, N,N-diundecylamine, N,N-didodecylamine, methylpropylamine, ethylpropylamine, propylbutylamine, ethylbutylamine, ethylpentylamine, propylpentylamine, butylpentylamine, triethylamine, tripropylamine, tributylamine, tripentylamine, trihexylamine, triheptylamine, trioctylamine, 1,2-ethylenediamine, N,N,N',N'-tetramethylethylenediamine, propane-1,3-diamine, N,N,N',N'-tetramethylpropane-1,3-diamine, butane-1,4-diamine, and N,N,N',N'-tetramethylbutane-1,4-diamine, and the like, or mixtures thereof. In specific embodiments, the silver nanoparticles are stabilized with dodecylamine, tridecylamine, tetradecylamine, pentadecylamine, hexadecylamine or mixtures thereof.

The organoamine is desirably added in two steps. A first amount of organoamine is present in the solution before the silver salt is added, and a second amount of organoamine is added to the solution after or during when the silver salt is added. The weight ratio of the organic solvent to the first amount of organoamine may be, for example, from about 1:0.8 to about 1:1.2, for example, from about 1:0.9 to about 1:1.1 or about 1:1. The weight ratio of the first amount of organoamine to the second amount of organoamine, for example, may be from about 1.7:1 to about 1:1.7, for example from about 1:0.9 to about 1:1.1 or about 1:1. The organoamine added to the solution as a first amount and as a second amount may be the same or different organoamine.

The solution comprising the organic solvent and the first amount of organoamine is heated to a first, elevated temperature. This first, elevated temperature may be from about 50° C. to about 80° C., for example, from about 60° C. to about 75° C., for example from about 65° C. to about 70° C. The solution is generally maintained at atmospheric pressure, and the solution may be agitated or stirred as well. The solution should be placed under an inert atmosphere blanket such as nitrogen or argon.

The silver salt is added to the heated solution. Exemplary silver salts include silver acetate, silver nitrate, silver oxide, silver acetylacetonate, silver benzoate, silver bromate, silver bromide, silver carbonate, silver chloride, silver citrate, silver fluoride, silver iodate, silver iodide, silver lactate, silver nitrite, silver perchlorate, silver phosphate, silver sulfate, silver sulfide, silver trifluoroacetate or combinations thereof. The silver salt is desirably suitable for homogeneous dispersion in the solution, which aids in efficient reaction. The silver salt may be in particulate form when added to the solution. The silver salt particles may generally be added rapidly as they dissolve quickly.

The second amount of organoamine is then added to the solution. The first amount of organoamine and the second amount of organoamine comprises the total amount of organoamine for the solution. The molar ratio of silver salt to the total organoamine added may be, for example, from about 1:4 to about 1:10, such as, from about 1:4 to about 1:8 or about 1:5. The solution may be cooled after the second amount of organoamine is added. The solution may be cooled over a period of about 45 minutes or more. The solution may be cooled to a lower, second temperature of from about 40° C. to about 60° C., for example, from about 45° C. to about 55° C. to about 48° C. to about 52° C.

This two-step process of adding the organoamine may result in consistently reproducible dissolution of the silver salt into the solution, allowing the attainment of higher quality silver nanoparticles.

A hydrazine is added to the solution. One purpose of the hydrazine is to reduce the silver salt from $Ag^{1+}$ to $Ag^{0}$. The reduced silver salt and the organoamine then react to form an organoamine-stabilized silver nanoparticle. The reaction can occur for a period of time ranging from about 5 minutes to about 2 hours. The solution can be mixed or stirred during this reaction as well. Generally, the solution is maintained at the second temperature during the reaction.

The hydrazine reducing agent is introduced to the reaction solution as a hydrazine reducing solution. The hydrazine reducing solution can be formed by mixing a hydrazine reducing agent with a solvent. Once this hydrazine reducing solution is prepared, it may be introduced to the reaction solution. The hydrazine reducing solution herein includes a hydrazine compound in a liquid system. As used herein, the term "hydrazine compound" refers to, for example, a hydrazine ($N_2H_4$), substituted hydrazines or suitable hydrates of hydrazine. The substituted hydrazine may contain from about 1 carbon atom to about 30 carbon atoms, such as from about 1 carbon atom to about 25 carbon atoms, from about 2 carbon atoms to about 20 carbon atoms or from about 2 carbon atoms to about 16 carbon atoms. In embodiments, the substituted hydrazine may include, for example, a hydrocarbyl hydrazine, a hydrazide, a carbazate or a sulfonohydrazide. Examples of suitable hydrates of hydrazine include, for example, hydrazine acid tartrate, hydrazine monohydrobromide, hydrazine monohydrochloride, hydrazine dichloride, hydrazine monooxalate, and hydrazine sulfate, and hydrates of substituted hydrazines. The use of a hydrazine compound as a reducing agent may have a number of advantages, such as, for example, 1) having solubility in water, polar or nonpolar organic solvents depending on the substitution; 2) having strong to weak reducing ability depending on the substitution; and 3) nonexistence of non-volatile metal ions as in other reducing agents such as, for example, sodium hydroboride, which would facilitate the removal of by-product or unreacted reducing agent.

Examples of hydrocarbyl hydrazine include, for example, $RNHNH_2$, RNHNHR' and $RR'NNH_2$, where one nitrogen atom is mono- or di-substituted with R or R', and the other nitrogen atom is optionally mono- or di-substituted with R or R', where each R or R' is a hydrocarbon group. Examples of hydrocarbyl hydrazines include, for example, methylhydrazine, tert-butylhydrazine, 2-hydroxyethylhydrazine, benzylhydrazine, phenylhydrazine, tolylhydrazine, bromophenylhydrazine, chlorophenylhydrazine, nitrophenylhydrazine, 1,1-dimethylhydrazine, 1,1-diphenylhydrazine, 1,2-diethylhydrazine, and 1,2-diphenylhydrazine. Unless otherwise indicated, in identifying the substituents for R and R' of the various hydrazine compounds, the phrase "hydrocarbon group" encompasses both unsubstituted hydrocarbon groups and substituted hydrocarbon groups. Unsubstituted hydrocarbon groups may include any suitable substituent such as, for example, a hydrogen atom, a straight chain or branched alkyl group, a cycloalkyl group, an aryl group, an alkylaryl group, arylalkyl group or combinations thereof. Examples of alkyl and cycloalkyl substituents include, for example, methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, or eicosanyl, and combinations thereof. Aryl groups substituents may contain from about 6 to about 48 carbon atoms, such as from about 6 to about 36 carbon atoms, from about 6 to about 24 carbon atoms. Examples of aryl substituents include, for example, phenyl, methylphenyl(tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, octadecylphenyl, or combinations thereof. Substituted hydrocarbon groups may be the unsubstituted hydrocarbon groups described herein which are substituted with one, two or more times with, for example, a halogen (chlorine, fluorine, bromine and iodine), a nitro group, a cyano group, an alkoxy group (methoxyl, ethoxyl and propoxy), or heteroaryls.

Any suitable liquid or solvent may be used for the hydrazine compound reducing agent solution, including, for example, organic solvents and water. The liquid organic solvent may comprise, for example, an alcohol such as methanol, ethanol, propanol, butanol, pentanol, hexanol, heptanol, octanol, a hydrocarbon solvent such as pentane, hexane, cyclohexane, heptane, octane, nonane, decane, undecane, dodecane, tridecane, toluene, xylene, mesitylene, tetrahydrofuran, chlorobenzene, dichlorobenzene, trichlorobenzene, nitrobenzene, cyanobenzene, acetonitrile, or mixtures thereof.

The weight percentage of solvent in the hydrazine compound reducing agent solution is, for example, from about 0 weight percent to about 95 weight percent, such as from about 20 weight percent to about 80 weight percent or from about 30 weight percent to about 60 weight percent of the total solution weight. The concentration of the hydrazine compound in the reducing agent solution may be, for example, from about 1 weight percent to about 100 weight percent, such as from about 5 weight percent to about 80 weight percent, from about 10 weight percent to about 60 weight percent, or from about 15 weight percent to about 50 weight percent, of the solution.

One, two, three or more solvents may be used in the hydrazine compound reducing agent solution. In embodiments where two or more solvents are used, each solvent may be present at any suitable volume ratio or weight ratio such as, for example, from about 99 (first solvent):1 (second solvent) to about 1 (first solvent):99 (second solvent).

Furthermore, the organohydrazine may have the formula:

wherein $R^1$, $R^2$, $R^3$, and $R^4$ are independently selected from hydrogen, an alkyl group, of 1 to 30 carbon atoms, for example, methyl, ethyl, propyl, or butyl, and an aryl group of 6 to 48 carbon atoms; and wherein at least one of $R^1$, $R^2$, $R^3$, and $R^4$ is not hydrogen. In more specific embodiments, the organohydrazine may be of the formula $R^1R^2N$—$NH_2$. Exemplary organohydrazines include phenylhydrazine.

Examples of hydrazine compounds may also include, for example, hydrazides, $RC(O)NHNH_2$ and $RC(O)NHNHR'$ and $RC(O)NHNHC(O)R$, where one or both nitrogen atoms are substituted by an acyl group of formula $RC(O)$, where each R is independently selected from hydrogen and a hydrocarbon group, and one or both nitrogen atoms are optionally mono- or di-substituted with R', where each R' is an independently selected hydrocarbon group. Examples of hydrazides may include, for example, formic hydrazide, acetohydrazide, benzohydrazide, adipic acid dihydrazide, carbohydrazide, butanohydrazide, hexanoic hydrazide, octanoic hydrazide, oxamic acid hydrazide, maleic hydrazide, N-methylhydrazinecarboxamide, and semicarbazide.

Examples of hydrazine compounds may also include, for example, carbazates and hydrazinocarboxylates, for example, $ROC(O)NHNHR'$, $ROC(O)NHNH_2$ and $ROC(O)NHNHC(O)OR$, where one or both nitrogen atoms are substituted by an ester group of formula $ROC(O)$, where each R is independently selected from hydrogen and a hydrocarbon group, and one or both nitrogen atoms are optionally mono- or di-substituted with R', where each R' is an independently selected hydrocarbon group. Examples of carbazate may include, for example, methyl carbazate (methyl hydrazinocarboxylate), ethyl carbazate, butyl carbazate, benzyl carbazate, and 2-hydroxyethyl carbazate.

Examples of sulfonohydrazides include, for example, $RSO_2NHNH_2$, $RSO_2NHNHR'$, and $RSO_2NHNHSO_2R$, where one or both nitrogen atoms are substituted by a sulfonyl group of formula $RSO_2$, where each R is independently selected from hydrogen and a hydrocarbon group, and one or both nitrogen atoms are optionally mono- or di-substituted with R', where each R' is an independently selected hydrocarbon group. Examples of sulfonohydrazides may include, for example, methanesulfonohydrazide, benzenesulfonohydrazide, 2,4,6-trimethylbenzenesulfonohydrazide, and p-toluenesulfonohydrazide.

Other hydrazine compounds may include, for example, aminoguanidine, thiosemicarbazide, methyl hydrazinecarbimidothiolate, and thiocarbohydrazide.

The organoamine-stabilized silver nanoparticles formed may be recovered from the reaction solution. The reaction solution can be cooled down to a third, lower temperature, such as from about 35° C. to about 45° C., for example, from abut 37° C. to about 43° C. or to about 39° C. to about 41° C. The nanoparticles may be separated by filtering the nanoparticles from the mother liquor. The filtration process may be done by filtering the reaction solution using a filter fitted with an appropriately sized filter, such as a 0.5 μm Gore-tex membrane. The silver nanoparticles may then be reslurried and rewashed with a solvent and then refiltered using the same filter membrane. The silver nanoparticles may then be washed with a non-solvent to remove any remaining solvent from the surface of the nanoparticles. A non-solvent is added because the nanoparticles will not dissolve with this addition. After the non-solvent is added an alcohol, desirably, isopropanol, is added to the solution. The addition of the alcohol causes the precipitation of the silver nanoparticles from the slurry. Also, the use of the non-solvent and the alcohol may improve the shelf life and the purity of the organoamine-stabilized silver nanoparticles. Exemplary non-solvents include acetone, methanol, ethanol, propanol, methyl ethyl ketone, acetonitrile, isobutyl alcohol, other ketones and alcohols, and combinations thereof. An ideal non-solvent is methanol. Desirably, the volume ratio of alcohol to non-solvent is about 0.4.

The washed silver nanoparticles may then be dried in a vacuum oven at about 30° C. to about 40° C. overnight. The dried silver nanoparticles are in a dry powder form with a metallic blue color.

The resulting nanoparticles have an average diameter of 1,000 nanometers or less. In more specific embodiments, the nanoparticles have an average diameter of from about 1 nanometer to about 10 nanometers, including from about 2 nanometers to about 8 nanometers. In other embodiments, the nanoparticles may also have a narrow particle size distribution, the difference between the diameter of the largest nanoparticle and the diameter of the smallest nanoparticle of about 10 nanometers.

The nanoparticles may have a silver content of 85% or more, including from 80% to about 90%. This content is higher than that produced by conventional processes. The organoamine-stabilized silver nanoparticles are in powder form, easily dispersible, and have improved shelf life and stability. Because the nanoparticles are not in a paste form, they are not sticky, easier to handle, and disperse more homogeneously. The processes are also reproducible and scale up more consistently than prior processes.

The silver nanoparticles described herein are stabilized by an organoamine that is associated with the surface of the silver nanoparticle and is not removed until the annealing of the silver nanoparticles during formation of silver features on a substrate.

In embodiments, the stabilizer is physically or chemically associated with the surface of the silver nanoparticles. In this way, the nanoparticles have the stabilizer thereon outside of a liquid solution. That is, the nanoparticles with the stabilizer thereon may be isolated and recovered from a reaction mixture solution used in forming the nanoparticles and stabilizer complex. The stabilized nanoparticles may thus be subsequently readily and homogenously dispersed in a solvent for forming a printable solution.

As used herein, the phrase "physically or chemically associated" between the silver nanoparticles and the stabilizer may be a chemical bond and/or other physical attachment. The chemical bond can take the form of, for example, covalent bonding, hydrogen bonding, coordination complex bonding, ionic bonding or a mixture of different chemical bonds. The physical attachment can take the form of, for example, van der Waals' forces, dipole-dipole interaction or a mixture of different physical attachments.

The extent of the coverage of stabilizer on the surface of the metal nanoparticles can vary, for example, from partial to full coverage depending on the capability of the stabilizer to stabilize the silver nanoparticles. Of course, there is variability as well in the extent of coverage of the stabilizer among the individual silver nanoparticles.

The weight percentage of the stabilizer in the silver nanoparticles solution may be from, for example, about 5 weight percent to about 80 weight percent, from about 10 weight percent to about 60 weight percent or from about 15 weight percent to about 50 weight percent.

The resulting elements may be used as electrodes, conductive pads, thin-film transistors, conductive lines, conductive tracks, and the like in electronic devices such as thin film transistors, organic light emitting diodes, RFID (radio frequency identification) tags, photovoltaic, printed antenna and other electronic devices which require conductive elements or components.

In yet other embodiments, there is provided a thin film transistor comprising:
  (a) an insulating layer;
  (b) a gate electrode;
  (c) a semiconductor layer;
  (d) a source electrode; and
  (e) a drain electrode,
wherein the insulating layer, the gate electrode, the semiconductor layer, the source electrode, and the drain electrode are in any sequence as long as the gate electrode and the semiconductor layer both contact the insulating layer, and the source electrode and the drain electrode both contact the semiconductor layer, and
  wherein at least one of the source electrode, the drain electrode, and the gate electrode are formed by: providing a solution containing silver nanoparticles and a silicone modified polyacrylate compound, depositing the solution onto the substrate, and heating the solution on the substrate to a temperature from about 100° C. to about 200° C. to form conductive features on the substrate.

A gate electrode, a source electrode, and a drain electrode may thus be fabricated by embodiments herein. The thickness of the gate electrode layer ranges for example from about 10 to about 2,000 nm. Typical thicknesses of source and drain electrodes are, for example, from about 40 nm to about 1 micrometer with the more specific thickness being about 60 nanometers to about 400 nm.

The insulating layer generally can be an inorganic material film or an organic polymer film. Examples of inorganic materials suitable as the insulating layer may include, for example, silicon oxide, silicon nitride, aluminum oxide, barium titanate, barium zirconium titanate and the like. Illustrative examples of organic polymers for the insulating layer may include, for example, polyesters, polycarbonates, poly(vinyl phenol), polyimides, polystyrene, poly(methacrylate)s, poly(acrylate)s, epoxy resin and the like. The thickness of the insulating layer is, for example from about 10 nm to about 500 nm depending on the dielectric constant of the dielectric material used. An exemplary thickness of the insulating layer is from about 100 nm to about 500 nm. The insulating layer may have a conductivity that is, for example, less than about $10^{-12}$ S/cm.

Situated, for example, between and in contact with the insulating layer and the source/drain electrodes is the semiconductor layer wherein the thickness of the semiconductor layer is generally, for example, about 10 nm to about 1 micrometer, or about 40 to about 100 nm. Any semiconductor material may be used to form this layer. Exemplary semiconductor materials include regioregular polythiophene, oligothiophene, pentacene, and the semiconductor polymers disclosed in U.S. Publication No. 2003/0160230 A1; U.S. Publication No. 2003/0160234 A1; U.S. Publication No. 2003/0136958 A1; the disclosures of which are totally incorporated herein by reference. Any suitable technique may be used to form the semiconductor layer. One such method is to apply a vacuum of about $10^{-5}$ torr to $10^{-7}$ torr to a chamber containing a substrate and a source vessel that holds the compound in powdered form, and heat the vessel until the compound sublimes onto the substrate. The semiconductor layer can also generally be fabricated by solution processes such as spin coating, casting, screen printing, stamping, or jet printing of a solution or dispersion of the semiconductor.

The insulating layer, the gate electrode, the semiconductor layer, the source electrode, and the drain electrode are formed in any sequence, particularly where in embodiments the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of thin film transistors are described in U.S. Pat. No. 6,107,117, the disclosure of which is totally incorporated herein by reference.

In embodiments, at least one of the gate, source or drain electrode in a thin-film transistor is formed by using a method described herein to form conductive features on a substrate, providing a solution containing a plurality organoamine-stabilized silver nanoparticles; depositing the solution onto the substrate, wherein during the deposition or following the deposition of the solution onto the substrate the organoamine-stabilizer is removed at a temperature below about 200° C., to form conductive features on the substrate.

Embodiments herein are further illustrated by way of the following examples. All percentages and parts are by weight unless otherwise indicated. Room temperature refers to a temperature ranging, for example, from about 20° C. to about 25° C.

EXAMPLES

Comparative Example 1

In a 1 L jacketed reactor with a nitrogen blanket, a first portion of 144.6 grams of hexadecylamine with 10 mL of toluene at a 1:1 weight was heated to about 65° C. under mechanical agitation. 20 grams of silver acetate was added to the solution. A second 144.6 portion of hexadecylamine was added to the solution and the solution was cooled to 55° C. A solution of 7.13 grams of phenylhydrazine and 10 mL of toluene was prepared and added to the reaction mixture after the cooling. The combined solution was mixed for an additional 15 minutes to ensure the reaction was completed. The solution was then cooled to about 40° C.

Isopropanol and methanol were used to isolate the silver nanoparticles by first adding 240 mL of isopropanol to the solution, followed by 560 mL of methanol. The solution was agitated for 5 additional minutes before discharge. The silver nanoparticles were collected using a filter fitted with a 0.5 μm Gore-tex membrane. The cake was re-slurry washed with 100 mL of isopropanol for half an hour and was refiltered through the same filter. Then three 50 mL methanol rinses were performed to remove the isopropanol from the particles. The collected nanoparticles were dried in a vacuum oven at between 30 to 40° C. overnight. The final yield of product was 15.2 grams (96% theoretical) containing 80 percent silver. The final yield of product was determined using Thermal Gravitational Analysis and Ash Content Analysis.

Example 1

Synthesis of Hexadecylamine Stabilized Silver Nanoparticles at 6 L Scale

Hexadecylamine was preheated to 50-60° C. to melt in a conventional oven. 723 grams of 1-hexadecylamine (3 moles) (5 time molar excess, Aldrich, 90% purity) and 700 mL of toluene were heated to around 65° C. under agitation in a 6 L jacketed reactor under nitrogen blanket. 200 grams of silver acetate (1.2 moles) (Alfa aesar, 99% purity) was then added to the reactor over 10 minutes followed by an additional amount of 100 mL of toluene. A second portion of hexadecylamine (723 grams, 3 moles) was added into the reactor and the reaction mixture was cooled to 55° C. over a 1 hour period before reduction. The molar ratio of silver salt to total organoamine is 1:5. 71.5 grams of phenylhydrazine (Aldrich, 97% purity) diluted in 60 mL of toluene was added to the reactor over 20 minutes. The reaction became a black-red color liquid, indicating the reduction of silver particles. The solution was mixed for an additional 15 minutes to ensure completion of the reduction reaction.

The reactor was then cooled to below 50° C. and the product was precipitated by adding 1600 mL of isopropanol followed by 3900 mL of methanol. The solution turned a dark purple-blue color. The mixture was allowed to mix for 10 minutes and then discharged and transferred to a vacuum filtration unit with an 8-inch diameter filter fitted with a 0.5 μm Gore-tex membrane. The metallic blue cake was dispersed in 2400 mL of isopropanol to remove any residual amines and by-products form the reaction and was filtered using the same filter media. The cake was again dispersed into isopropanol and washed for half an hour and was filtered using the same filtration unit. This was followed by three methanol rinses to help remove the isopropanol from the product (total of 750 mL of methanol). The particles were then dried in a vacuum oven overnight at 30-40° C. The final yield of product was 145 grams (96% theoretical) containing 86% silver (estimated from ASH analysis).

Example 2

Synthesis of Hexadecylamine Stabilized Silver Nanoparticles at 6 L Scale

Hexadecylamine was preheated to 50-60° C. to melt in a conventional oven. 911 grams of 1-hexadecylamine (3.8 moles) (5 time molar excess, Aldrich, 90% purity) and 600 mL of toluene were heated to around 65° C. under agitation in a 6 L jacketed reactor under nitrogen blanket. 200 grams of silver acetate (1.2 moles) (Alfa aesar, 99% purity) was then added to the reactor over 10 minutes followed by an additional amount of 100 mL of toluene. A second portion of hexadecylamine (535 grams, 2.2 moles) was added into the reactor and the reaction mixture was cooled to 55° C. over a 1 hour period before reduction. The molar ratio of silver salt to total organoamine is 1:5. 71.5 grams of phenylhydrazine (Aldrich, 97% purity) diluted in 60 mL of toluene was added to the reactor over 20 minutes. The reaction became a black-red color liquid, indicating the reduction of silver particles. The solution was mixed for an additional 15 minutes to ensure completion of the reduction reaction.

The reactor was then cooled to below 50° C. and the product was precipitated by adding 1440 mL of isopropanol followed by 3360 mL of methanol. The solution turned a dark purple-blue color. The mixture was allowed to mix for 10 minutes and then discharged and transferred to a vacuum filtration unit with an 8-inch diameter filter fitted with a 0.5 μm Gore-tex membrane. The metallic blue cake was dispersed in 2400 mL of isopropanol for one hour to remove any residual amines and by-products form the reaction and was filtered using the same filter media. The cake was again dispersed into isopropanol and washed for half an hour and was filtered using the same filtration unit. This was followed by three methanol rinses to help remove the isopropanol from the product (total of 750 mL of methanol). The particles were then dried in a vacuum oven overnight at 30-40° C. The final yield of product was 140 grams (96% theoretical) containing 86% silver (estimated from ASH analysis).

Testing and Results

The mean particle size and silver content of the silver nanoparticles of Comparative Example 1, Example 1 and Example 2 were tested. Films were also made from these nanoparticles by deposition and annealing at 140° C. for 10 minutes. The conductivity of the films was measured. The results are presented in Table 1.

TABLE 1

| Sample | Mean Particle Size (nm) | Conductivity (S/cm) | Silver Content (%) |
| --- | --- | --- | --- |
| Comparative Example 1 | 4.8 | $5.5\text{-}7.7 \times 10^5$ | 80 |
| Example 1 | 5.1 | Matched Comparative Example 1 | 86 |
| Example 2 | 4.6 | Matched Comparative Example 1 | 86 |

The results showed that the methods of Examples 1 and 2 produced nanoparticles that had similar conductivity, and higher silver content compared to the Comparative Example 1. The addition of organoamine in two steps and the use of a two-solvent precipitation procedure using isopropanol and a non-solvent (methanol) both contributed to this result.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A method of producing organoamine-stabilized silver nanoparticles, comprising:
    forming a solution comprising an organic solvent and a first amount of organoamine and heating the solution to a first temperature; wherein the first temperature is from about 50° C. to about 80° C.;
    adding a silver salt to the solution heated to the first temperature;
    adding a second amount of organoamine to the solution heated to the first temperature;
    cooling the solution from the first temperature to a second temperature;
    adding a hydrazine to the solution to reduce the silver salt forming a reduced silver salt, and reacting the reduced silver salt with the organoamine to form organoamine-stabilized silver nanoparticles while maintaining the solution at the second temperature; and
    precipitating the solution after performing the reaction and recovering the organoamine-stabilized silver nanoparticles, by a two-solvent precipitation procedure comprising adding a non-solvent to the solution and then after the non-solvent is added, adding an alcohol to the solution;
    wherein the molar ratio of silver salt to total organoamine is from about 1:4 to about 1:10.

2. The method according to claim 1, wherein the silver salt is selected from the group consisting of silver acetate, silver nitrate, silver oxide, silver acetylacetonate, silver benzoate, silver bromate, silver bromide, silver carbonate, silver chloride, silver citrate, silver fluoride, silver iodate, silver iodide, silver lactate, silver nitrite, silver perchlorate, silver phosphate, silver sulfate, silver sulfide, silver trifluoroacetate and mixtures thereof.

3. The method according to claim 1, wherein a molar ratio of silver salt to total organoamine is about 1:5.

4. The method according to claim 1, wherein the organoamine-stabilized silver nanoparticles have a silver content of about 85 percent or more by weight.

5. The method according to claim 1, wherein the organic solvent is selected from the group consisting of toluene, heptane, hexane, benzene, cyclohexane, pentane, bromobenzene, chlorobenzene, hydrocarbons and mixtures thereof.

6. The method according to claim 1, wherein the organoamine-stabilized silver nanoparticles have a mean diameter of from about 1 nanometers to about 10 nanometers.

7. The method according to claim 1, wherein the first temperature is from about 65° C. to about 70° C.

8. The method according to claim 1, wherein the second temperature is from about 40° C. to about 60° C.

9. The method according to claim 1, wherein a weight ratio of organic solvent to the first amount of organoamine is from about 1:0.8 to about 1:1.2.

10. The method according to claim 1, wherein a weight ratio of the first amount of organoamine to the second amount of organoamine is from about 1.7:1.0 to about 1:1.7.

11. The method according to claim 1, wherein the hydrazine is of the formula:

$$R^1R^2N\text{—}NR^3R^4$$

wherein $R^1$, $R^2$, $R^3$ and $R^4$, independently, is hydrogen, an alkyl group of 1 to 30 carbons atoms or an aryl group of 6 to 48 carbons atoms; wherein at least one of the $R^1$, $R^2$, $R^3$ and $R^4$ is not hydrogen.

12. The method according to claim 1, wherein the hydrazine is first added to a solvent wherein the solvent is selected from the group consisting of an alcohol such as methanol, ethanol, propanol, butanol, pentanol, hexanol, heptanol, octanol, a hydrocarbon solvent such as pentane, hexane, cyclohexane, heptane, octane, nonane, decane, undecane, dodecane, tridecane, tetradecane, toluene, xylene, mesitylene, tetrahydrofuran, or other solvents, such as, chlorobenzene, dichlorobenzene, trichlorobenzene, nitrobenzene, cyanobenzene, acetonitrile and mixtures thereof, to produce a hydrazine reducing solution that is added to the solution.

13. The method according to claim 1, wherein the non-solvent is selected from the group consisting of acetone, methanol, ethanol, propanol, methyl ethyl ketone, acetonitrile, isobutyl alcohol and mixtures thereof.

14. A method of forming conductive features on a substrate, the method comprising:
    providing a liquid composition containing the organoamine-stabilized silver nanoparticles produced by the method of claim 1,
    depositing the liquid composition onto the substrate to form deposited features, and
    heating the deposited features on the substrate to a temperature from about 100° C. to about 200° C. to form conductive features on the substrate.

15. The method according to claim 14, wherein the deposited feature on the substrate is a film and conductivity of the film is 5.5-7.7×10⁵ S/cm.

16. The method according to claim 14, wherein the organoamine-stabilized silver nanoparticles have a narrow particle size distribution such that the difference between the diameter of the largest organoamine-stabilized silver nanoparticle and the diameter of the smallest organoamine-stabilized silver nanoparticle is 10 nanometers.

17. The method according to claim 14, wherein the organoamine-stabilized silver nanoparticles have a silver content of about 85 percent or more by weight.

18. The method according to claim 14, wherein the organoamine-stabilized silver nanoparticles have a mean diameter of from about 1 nanometer to about 10 nanometers.

19. The method according to claim 14, wherein the organoamine-stabilized silver nanoparticles have a mean diameter of from about 2 nanometers to about 8 nanometers.

* * * * *